United States Patent
Zhu et al.

(10) Patent No.: US 9,922,232 B2
(45) Date of Patent: Mar. 20, 2018

(54) FINGERPRINT IMAGING SYSTEM AND FORMING METHOD THEREOF HAVING A PLURALITY OF LIGHT TRANSMISSION REGIONS BETWEEN ADJACENT PHOTODIODES ON A BACKLIGHT SYSTEM

(71) Applicant: Shanghai Oxi Technology Co., Ltd, Shanghai (CN)

(72) Inventors: Hong Zhu, Shanghai (CN); Yan Ling, Shanghai (CN); Yajie Zheng, Shanghai (CN)

(73) Assignee: Shanghai Oxi Technology Co., Ltd., Shanghai (CN)

( * ) Notice: Subject to any disclaimer, the term of this patent is extended or adjusted under 35 U.S.C. 154(b) by 3 days.

(21) Appl. No.: 15/116,946

(22) PCT Filed: Oct. 12, 2015

(86) PCT No.: PCT/CN2015/091742
§ 371 (c)(1),
(2) Date: Aug. 5, 2016

(87) PCT Pub. No.: WO2017/063119
PCT Pub. Date: Apr. 20, 2017

(65) Prior Publication Data
US 2017/0270337 A1   Sep. 21, 2017

(51) Int. Cl.
*G06K 9/00* (2006.01)
*H01L 27/146* (2006.01)
*G01J 1/44* (2006.01)

(52) U.S. Cl.
CPC .............. *G06K 9/0004* (2013.01); *G01J 1/44* (2013.01); *H01L 27/14625* (2013.01);
(Continued)

(58) Field of Classification Search
CPC ............ G06K 9/00013; G06K 9/0008; G06K 9/00114; G01N 15/0211
(Continued)

(56) References Cited

U.S. PATENT DOCUMENTS 5,446,290 A   8/1995 Fujieda
9,304,631 B2 *  4/2016 Kang ............... G06F 3/044
(Continued)

FOREIGN PATENT DOCUMENTS

CN   204463158   7/2015
WO  WO 2014/109711   7/2014

OTHER PUBLICATIONS

International Search Report and Written Opinion from PCT/CN2015/091742, dated Jul. 4, 2016.

*Primary Examiner* — Que T Le
(74) *Attorney, Agent, or Firm* — Swanson & Bratschum, L.L.C.

(57) ABSTRACT

A fingerprint imaging system and a method for forming the same. The system includes: a backlight system; a sensor array on the backlight system, wherein the sensor array comprises a plurality of photodiodes and a plurality of light transmission regions between adjacent photodiodes; and an anti-light-scattering layer formed on the sensor array, wherein the anti-light-scattering layer comprises a plurality of first portions and a plurality of second portions disposed between adjacent first portions, wherein the plurality of first portions cover at least the plurality of photodiodes respectively, and refractivity of the plurality of first portions is greater than refractivity of the plurality of second portions.

16 Claims, 5 Drawing Sheets

(52) U.S. Cl.
CPC .. *H01L 27/14643* (2013.01); *H01L 27/14685* (2013.01); *H01L 27/14689* (2013.01); *G01J 2001/446* (2013.01)

(58) Field of Classification Search
USPC .................................. 250/208.1, 216, 221
See application file for complete search history.

(56) References Cited

U.S. PATENT DOCUMENTS

| | | |
|---|---|---|
| 2005/0213799 A1 | 9/2005 | Sawano |
| 2009/0074316 A1 | 3/2009 | Morita |
| 2012/0211644 A1 | 8/2012 | Zheng |
| 2013/0119237 A1 | 5/2013 | Raguin |

\* cited by examiner

FINGERPRINT IMAGING SYSTEM AND FORMING METHOD THEREOF HAVING A PLURALITY OF LIGHT TRANSMISSION REGIONS BETWEEN ADJACENT PHOTODIODES ON A BACKLIGHT SYSTEM

RELATED APPLICATIONS

This application is a 35 U.S.C. § 371 national phase application of PCT/CN2015/091742, filed on Oct. 12, 2015, entitled "Fingerprint Imaging System and Forming Method Thereof", which is incorporated herein by reference in its entirety.

FIELD OF THE DISCLOSURE

The present disclosure generally relates to fingerprint imaging technology, and more particularly, to a fingerprint imaging system and a forming method thereof.

BACKGROUND OF THE DISCLOSURE

Nowadays, fingerprint imaging systems have been widely used in various products. Generally, an optical fingerprint imaging system includes a backlight system and a sensor array. In some solutions, a fiber-optical plate as a protective plate is formed on the sensor array to protect the sensor array and reduce light scattering. However, some lights may be emitted from gratings of the fiber-optical plate with angle deviation, which still causes light scattering and crosstalk. Therefore, the possibility of light scattering and crosstalk in an optical fingerprint imaging system needs to be reduced.

SUMMARY

In an embodiment, a fingerprint imaging system is provided, including: a backlight system; a sensor array on the backlight system, wherein the sensor array includes a plurality of photodiodes and a plurality of light transmission regions between adjacent photodiodes; and an anti-light-scattering layer formed on the sensor array, wherein the anti-light-scattering layer includes a plurality of first portions and a plurality of second portions disposed between adjacent first portions, wherein the plurality of first portions cover at least the plurality of photodiodes respectively, and refractivity of the plurality of first portions is greater than refractivity of the plurality of second portions.

In some embodiments, the first and the second portions are nonopaque.

In some embodiments, the first portions may include silicon nitride, silicon oxide, an organic coating or ultraviolet rays glue.

In some embodiments, thickness of the anti-light-scattering layer may be within a range from 1 μm to 1000 μm.

In some embodiments, each first portion may further cover a portion of the corresponding light transmission region.

In some embodiments, the second portions may include air.

In some embodiments, the second portions may include silicon nitride, silicon oxide or a nonopaque organic material.

In some embodiments, the fingerprint imaging system may further include a protective layer on the anti-light-scattering layer, wherein the protective layer is a fiber-optical plate.

In an embodiment, a method for forming a fingerprint imaging system is provided, including: forming a backlight system; forming a sensor array on the backlight system, wherein the sensor array includes a plurality of photodiodes and a plurality of light transmission regions between adjacent photodiodes; forming an insulating layer on the sensor array; and performing an etching process to the insulating layer to form an anti-light-scattering layer which includes a plurality of first portions and a plurality of second portions between adjacent first portions, wherein the plurality of first portions cover at least the plurality of photodiodes respectively, and refractivity of the plurality of first portions is greater than refractivity of the plurality of second portions.

In some embodiments, the etching process may be performed to make each first portion further cover a portion of the corresponding light transmission region.

In some embodiments, the first and the second portions may be nonopaque.

In some embodiments, the first portions may include silicon nitride, silicon oxide, an organic coating or ultraviolet rays glue.

In some embodiments, thickness of the anti-light-scattering layer may be within a range from 1 μm to 1000 μm.

In some embodiments, the second portions may include air.

In some embodiments, the second portions may include silicon nitride, silicon oxide or a nonopaque organic material.

In some embodiments, the method may further include: forming a protective layer on the anti-light-scattering layer, wherein the protective layer is a fiber-optical plate.

DETAILED DESCRIPTION OF THE DISCLOSURE

Embodiments of the present disclosure provide fingerprint imaging systems, which may reduce the possibility of light scattering and crosstalk. In this way, a contrast ratio of adjacent pixels on an image to be formed may be increased, and the quality of the image may be improved accordingly.

In order to clarify the objects, characteristics and advantages of the disclosure, embodiments of present disclosure will be described in detail in conjunction with accompanying drawings.

In an embodiment, a fingerprint imaging system is provided. The fingerprint imaging system includes a backlight system, a sensor array on the backlight system, an anti-light-scattering layer on the sensor array and a protective layer on the anti-light-scattering layer.

In some embodiments, the backlight system may be configured to emit lights. The sensor array may be configured to sense lights and generate electronic signals based on the sensed lights. The protective layer may play a protecting role in the system and reduce the possibility of light scattering to a certain extent. In some embodiments, the protective layer may be a fiber-optical plate or be made of other transparent materials.

To further reduce the possibility of light scattering, the anti-light-scattering layer is disposed between the sensor array and the protective layer. The structure of the anti-light-scattering layer is described in detail below.

Figure 1:
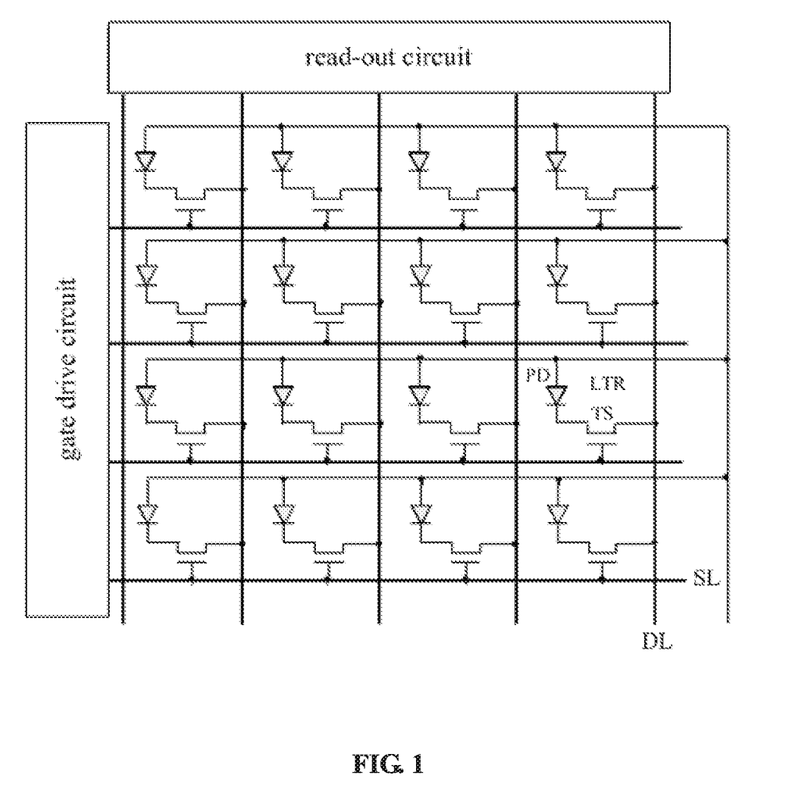
FIG. 1 schematically illustrates a structural diagram of a sensor array according to an embodiment of the present disclosure.

FIG. 1 schematically illustrates a structural diagram of the sensor array according to an embodiment. Referring to FIG. 1, the sensor array includes a plurality of photodiodes PD, a plurality of Thin Film Transistor (TFT) switches TS, a plurality of light transmission regions LTR, where a plurality of scanning lines SL and a plurality of data lines DL are disposed in the light transmission regions LTR.

The plurality of scanning lines SL and the plurality of data lines DL are arranged in arrays to form a pixel array including a plurality of pixel cells. Each pixel cell includes a photodiode PD and a TFT switch TS. The photodiode PD is configured to convert sensed lights into charges, and the TFT switch TS is configured to control on/off of the pixel cell. Gates of TFT switches TS in pixel cells in a same line share one scanning line SL, and drains of TFT switches TS in pixel cells in a same column share one data line DL. The scanning lines SL are connected to and controlled by a gate drive circuit, and the data lines DL are connected to and controlled by a read-out circuit.

Figure 2:
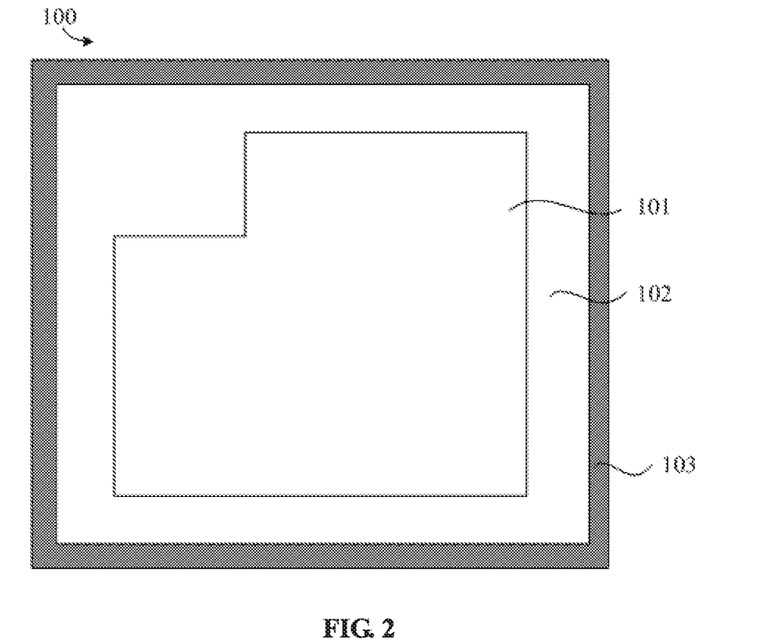
FIG. 2 schematically illustrates a vertical view of a pixel cell according to an embodiment of the present disclosure.

FIG. 2 schematically illustrates a vertical view of a pixel cell 100 according to an embodiment. Referring to FIG. 2, the pixel cell 100 includes the photodiode 101, and the light transmission region 102 which includes the data and the scanning lines 103. For facilitating illustration, TFT switches are not shown in FIG. 2.

Figure 3:
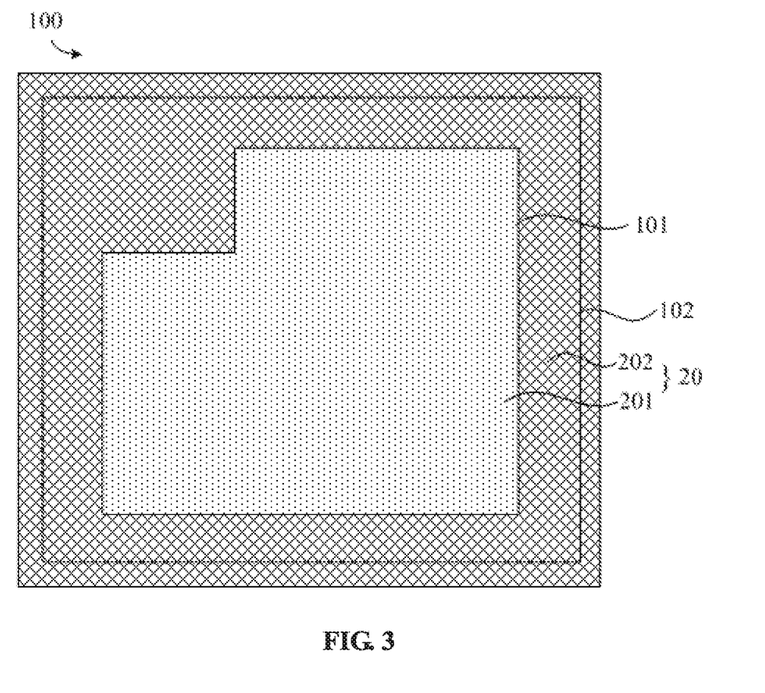
FIG. 3 schematically illustrates a vertical view of the pixel cell in FIG. 2 after an anti-light-scattering layer is formed thereon according to an embodiment of the present disclosure.

FIG. 3 schematically illustrates a vertical view of the pixel cell 100 after an anti-light-scattering layer 20 is formed thereon according to an embodiment of the present disclosure. Referring to FIG. 3, the anti-light-scattering layer 20 includes a first portion 201 covering the photodiode 101, and a second portion 202 covering the light transmission region 102.

Figure 4:
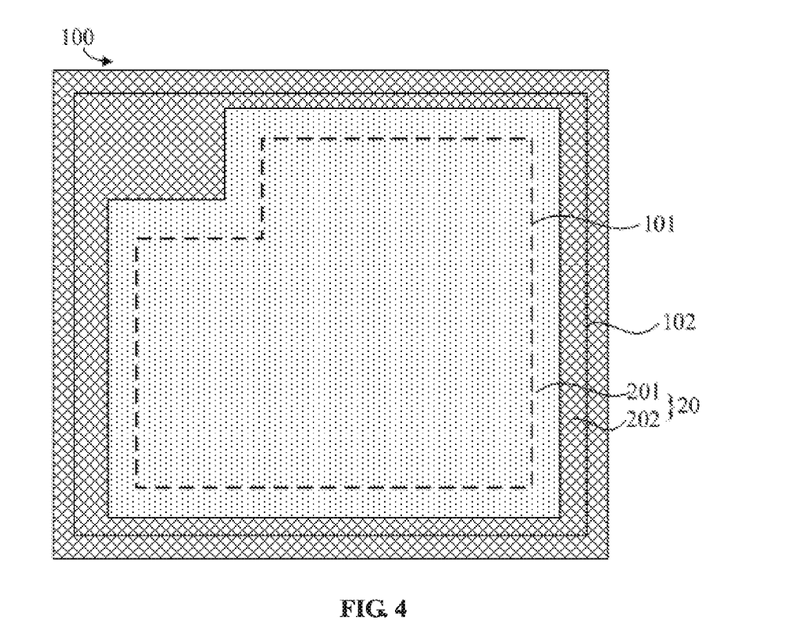
FIG. 4 schematically illustrates a vertical view of the pixel cell in FIG. 2 after an anti-light-scattering layer is formed thereon according to an embodiment of the present disclosure.

FIG. 4 schematically illustrates a vertical view of the pixel cell 100 after an anti-light-scattering layer 20 is formed thereon according to an embodiment of the present disclosure. Referring to FIG. 4, the anti-light-scattering layer 20 includes a first portion 201 covering the photodiode 101 and a portion of the light transmission region 102 which is adjacent to the photodiode 101, and a second portion 202 covering other portions of the light transmission region 102.

In some embodiments, the first portion 201 of the anti-light-scattering layer 20 is nonopaque, and may include silicon nitride, silicon oxide, an organic coating or ultraviolet rays glue.

In some embodiments, the second portion 202 of the anti-light-scattering layer 20 is nonopaque. In some embodiments, the second portion 202 of the anti-light-scattering layer 20 may include air. In some embodiments, the second portion 202 may include silicon nitride, silicon oxide or a nonopaque organic material.

In some embodiments, refractivity of the first portion 201 may be greater than refractivity of the second portion 202.

Figure 5:
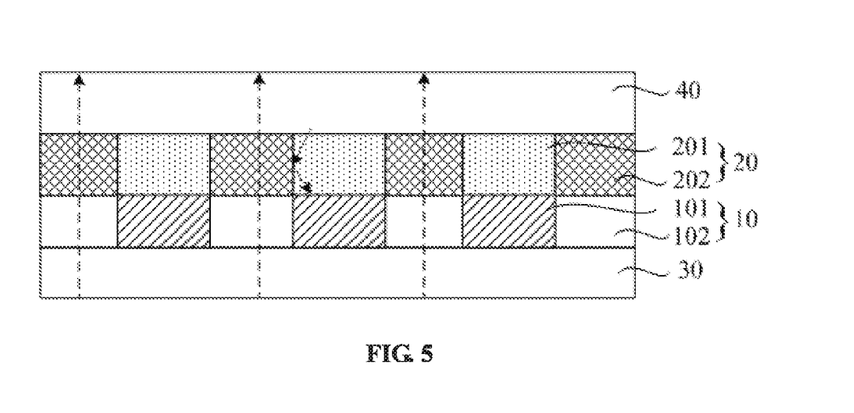
FIG. 5 schematically illustrates a cross-sectional view of a fingerprint imaging system after an anti-light-scattering layer is formed therein according to an embodiment of the present disclosure.
Figure 6:
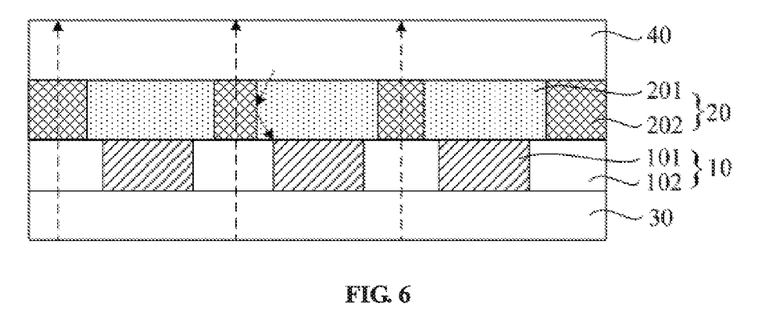
FIG. 6 schematically illustrates a cross-sectional view of a fingerprint imaging system after an anti-light-scattering layer is formed therein according to an embodiment of the present disclosure.

FIG. 5 schematically illustrates a cross-sectional view of the fingerprint imaging system where first portions 201 only cover the photodiodes 101. FIG. 6 schematically illustrates a cross-sectional view of the fingerprint imaging system where first portions 201 cover the photodiodes 101 and a portion of the light transmission regions 102 adjacent to the photodiodes 101. In FIGS. 5 and 6, TFT switches, data lines and scanning lines are not shown in the sensor array 10.

Referring to FIG. 5, the backlight system 30 emits light, and the light is reflected by a finger on a surface of the protective layer 40. When the light enters into the first portion 201 of the anti-light-scattering layer 20 and reaches a contact surface between the first portion 201 and the second portion 202, as the refractivity of the first portion 201 is greater than the refractivity of the second portion 202, the light cannot penetrate the contact surface to enter into the second portion 202, and is reflected on the contact surface. In this way, the light reflected by the finger corresponding to a particular pixel cell cannot enter into adjacent pixel cells, which may avoid light scattering and crosstalk, and further ensure the quality of fingerprint images.

In some embodiments, thickness of the anti-light-scattering layer 20 cannot be too great or too small. On one hand, if the thickness is too small, the light cannot be reflected at the contact surface between the first portion 201 and the second portion 202. On the other hand, if the thickness is too great, it may be relatively difficult to form the anti-light-scattering layer 20, and manufacturing cost may be relatively high. In view of the above consideration, in some embodiments, thickness of the anti-light-scattering layer 20 may be within a range from 1 μm to 1000 μm. It should be noted that, the present disclosure is not limited thereto.

Referring to FIG. 6, similar with FIG. 5, when light enters into the first portion 201 of the anti-light-scattering layer 20 and reaches a contact surface between the first portion 201 and the second portion 202, the light cannot penetrate the contact surface to enter into the second portion 202, and is reflected on the contact surface.

Accordingly, in an embodiment, a method for forming a fingerprint imaging system is provided. The method may include: forming a backlight system; forming a sensor array on the backlight system, wherein the sensor array includes a plurality of photodiodes and a plurality of light transmission regions between adjacent photodiodes; forming an insulating layer on the sensor array; and performing an etching process to the insulating layer to form an anti-light-scattering layer which includes a plurality of first portions and a plurality of second portions between adjacent first portions, wherein the plurality of first portions cover at least the plurality of photodiodes respectively, and refractivity of the plurality of first portions is greater than refractivity of the plurality of second portions.

In some embodiments, the etching process may be performed to make each first portion further cover a portion of the corresponding light transmission region.

In some embodiments, the first and the second portions may be nonopaque.

In some embodiments, the first portions may include silicon nitride, silicon oxide, an organic coating or ultraviolet rays glue.

In some embodiments, thickness of the anti-light-scattering layer may be within a range from 1 μm to 1000 μm.

In some embodiments, the method may further include: forming a protective layer on the anti-light-scattering layer. In some embodiments, the protective layer may be a fiber-optical plate.

In some embodiments, the second portions may include air. In some embodiments, the second portions may include silicon nitride, silicon oxide or a nonopaque organic material.

Figure 7:
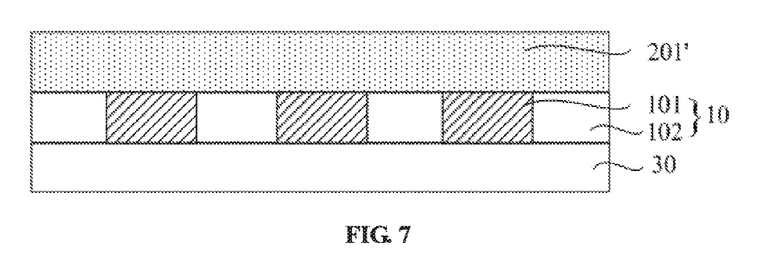
FIGS. 7 and 8 schematically illustrate intermediate cross-sectional views of forming an anti-light-scattering layer according to an embodiment.
Figure 8:
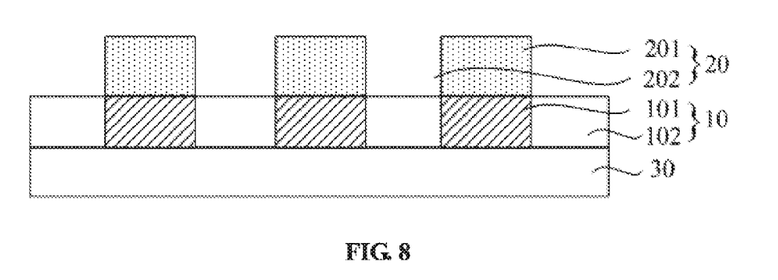

FIGS. 7 and 8 schematically illustrate intermediate cross-sectional views of forming the anti-light-scattering layer according to an embodiment, wherein the second portions are air.

Referring to FIG. 7, after the backlight system 30 and the sensor array 10 which includes the photodiodes 101 and the light transmission regions 102 are formed, a first nonopaque layer 201' is formed on the sensor array 10 by deposition. Afterward, referring to FIG. 8, a portion of the first nonopaque layer 201' is etched by a mask to form the first portions 201 on the photodiodes 101 respectively, while other portions (namely, the second portions 202) of the first nonopaque layer 201' are air. The first portions 201 and the second portions 202 constitute the anti-light-scattering layer 20. Afterward, the protective layer 40 is formed on the anti-light-scattering layer 20 to form the fingerprint imaging system shown in FIG. 5.

Figure 9:
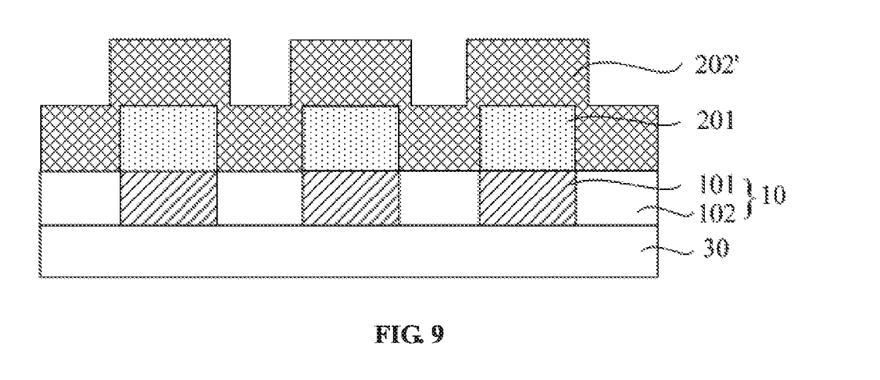
FIGS. 9 and 10 schematically illustrate intermediate cross-sectional views of forming an anti-light-scattering layer according to an embodiment.
Figure 10:
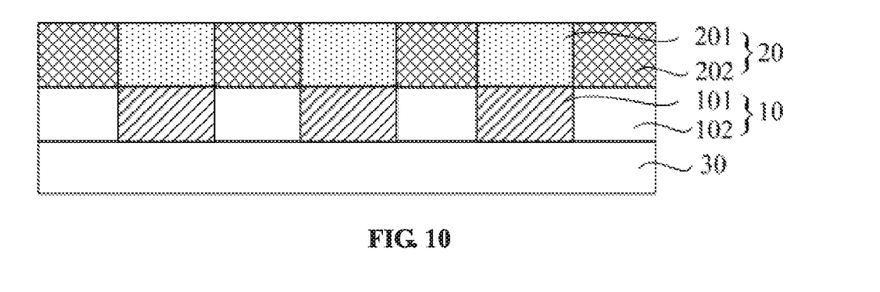

In some embodiments, the second portions include silicon nitride, silicon oxide or a nonopaque organic material. FIGS. 9 and 10 schematically illustrate intermediate cross-sectional views of forming the anti-light-scattering layer according to an embodiment.

Referring to FIGS. 8 and 9, after a portion of the first nonopaque layer 201' is etched by a mask to form the first portions 201, a second nonopaque layer 202' is formed to cover the first portions 201 and a surface of the sensor array 10 by deposition. Afterward, referring to FIG. 10, a portion of the second nonopaque layer 202' is removed to make the remained second nonopaque layer 202' aligned with the first portions 201. The first portions 201 and the remained second nonopaque layer 202' which serves as the second portions 202 constitute the anti-light-scattering layer 20. Afterward, the protective layer 40 is formed on the anti-light-scattering layer 20 to form the fingerprint imaging system shown in FIG. 5.

From above, fingerprint imaging systems and a method for forming the same are provided in embodiments of the present disclosure. The fingerprint imaging system includes a backlight system, a sensor array including a plurality of photodiodes and a plurality of light transmission regions between adjacent photodiodes, and an anti-light-scattering layer including a plurality of first portions and a plurality of second portions disposed between adjacent first portions. The plurality of first portions cover at least the plurality of photodiodes respectively, and have the refractivity greater than that of the second portions. As the refractivity of the first portions is greater than the refractivity of the second portions, light cannot penetrate a contact surface therebetween to enter into the second portions, and is reflected on the contact surface. In this way, the possibility of light scattering and crosstalk may be reduced. A contrast ratio of adjacent pixels on an image to be formed may be increased, and the quality of the image may be improved accordingly.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A fingerprint imaging system, comprising:
a backlight system;
a sensor array on the backlight system, wherein the sensor array comprises a plurality of photodiodes and a plurality of light transmission regions between adjacent photodiodes; and
an anti-light-scattering layer formed on the sensor array, wherein the anti-light-scattering layer comprises a plurality of first portions and a plurality of second portions disposed between adjacent first portions, wherein the plurality of first portions cover at least the plurality of photodiodes respectively, and refractivity of the plurality of first portions is greater than refractivity of the plurality of second portions.

2. The system according to claim 1, wherein the first and the second portions are nonopaque.

3. The system according to claim 1, wherein the first portions comprise silicon nitride, silicon oxide, an organic coating or ultraviolet rays glue.

4. The system according to claim 1, wherein thickness of the anti-light-scattering layer is within a range from 1 μm to 1000 μm.

5. The system according to claim 1, wherein each first portion further covers a portion of the corresponding light transmission region.

6. The system according to claim 1, wherein the second portions comprise air.

7. The system according to claim 1, wherein the second portions comprise silicon nitride, silicon oxide or a nonopaque organic material.

8. The system according to claim 1, further comprising a protective layer on the anti-light-scattering layer, wherein the protective layer is a fiber-optical plate.

9. A method for forming a fingerprint imaging system, comprising:
forming a backlight system;
forming a sensor array on the backlight system, wherein the sensor array comprises a plurality of photodiodes and a plurality of light transmission regions between adjacent photodiodes;
forming an insulating layer on the sensor array; and
performing an etching process to the insulating layer to form an anti-light-scattering layer which comprises a plurality of first portions and a plurality of second portions between adjacent first portions, wherein the plurality of first portions cover at least the plurality of photodiodes respectively, and refractivity of the plurality of first portions is greater than refractivity of the plurality of second portions.

10. The method according to claim 9, wherein the etching process is performed to make each first portion further cover a portion of the corresponding light transmission region.

11. The method according to claim 9, wherein the first and the second portions are nonopaque.

12. The method according to claim 9, wherein the first portions comprise silicon nitride, silicon oxide, an organic coating or ultraviolet rays glue.

13. The method according to claim 9, wherein thickness of the anti-light-scattering layer is within a range from 1 μm to 1000 μm.

14. The method according to claim 9, wherein the second portions comprise air.

15. The method according to claim 9, wherein the second portions comprise silicon nitride, silicon oxide or a non-opaque organic material.

16. The method according to claim 9, further comprising: forming a protective layer on the anti-light-scattering layer, wherein the protective layer is a fiber-optical plate.

* * * * *